United States Patent [19]

Reich

[11] Patent Number: 4,926,443

[45] Date of Patent: May 15, 1990

[54] CORRECTION CIRCUIT FOR A DIGITAL QUADRATURE-SIGNAL PAIR

[75] Inventor: Werner Reich, Emmendingen, Fed. Rep. of Germany

[73] Assignee: Deutsche ITT Industries GmbH, Freiburg, Fed. Rep. of Germany

[21] Appl. No.: 347,379

[22] Filed: May 4, 1989

[30] Foreign Application Priority Data

May 27, 1988 [EP] European Pat. Off. ........ 88108442.0

[51] Int. Cl.$^5$ .............................................. H04B 1/10
[52] U.S. Cl. ...................................... 375/102; 375/15;
375/39; 375/98; 455/234; 455/304; 329/320
[58] Field of Search ................... 375/60, 15, 39, 98,
375/102; 455/234, 304, 60; 329/320

[56] References Cited

U.S. PATENT DOCUMENTS

| | | | |
|---|---|---|---|
| 3,699,463 | 10/1972 | Stone | 375/102 |
| 3,962,637 | 6/1976 | Motley et al. | 375/15 |
| 4,631,738 | 12/1986 | Betts et al. | 375/98 |
| 4,710,975 | 12/1987 | Okamoto et al. | 455/304 |
| 4,779,212 | 1/1989 | Mehrgardt | 370/20 |

FOREIGN PATENT DOCUMENTS

| | | |
|---|---|---|
| 0048229 | 9/1981 | European Pat. Off. . |
| 0074858 | 9/1982 | European Pat. Off. . |
| 0122657 | 10/1984 | European Pat. Off. . |
| 0180339 | 10/1985 | European Pat. Off. . |
| 0237590 | 9/1987 | European Pat. Off. . |

*Primary Examiner*—Douglas W. Olms
*Assistant Examiner*—Tesfaldet Bocure
*Attorney, Agent, or Firm*—Thomas L. Peterson

[57] ABSTRACT

A correction circuit for a digital signal pair having an in-phase signal and a quadrature signal includes a value determining stage and an error-detecting stage. The value-determining stage determines a maximum value and a minimum value for the in-phase signal, a maximum value and a minimum value for the quadrature signal, and two held values for the quadrature signal that correspond to the maximum and minimum values of the in-phase signal. These signals are used in the error-detecting stage to derive an in-phase offset error signal, a quadrature offset error signal, a phase-error signal, and an amplitude-error signal from which an in-phase-offset-correcting signal, a quadrature-offset-correcting signal, a quadrature phase-correcting signal, and quadrature amplitude-correcting signal are formed by associated controllers.

10 Claims, 4 Drawing Sheets

CORRECTION CIRCUIT FOR A DIGITAL QUADRATURE-SIGNAL PAIR

BACKGROUND OF THE INVENTION

1. Field of the Invention

The present invention relates to a correction circuit for a digital quadrature-signal pair in a digital color television receiver where the digital quadrature-signal pair comprises an in-phase signal and a quadrature signal.

2. Description of the Related Art

Analog or digital quadrature-signal pairs are used where two signals are to be transmitted simultaneously by means of a single carrier, e.g., in accordance with conventional color-television standards or by digital quadrature-amplitude modulation, but increasingly also where signals are converted to a different frequency band, e.g., for low-IF conversion of arbitrarily modulated signals, in some single-sideband conversion methods or in the digital processing of radar signals. The correction circuit according to the invention can be used to advantage for angle-modulated signals.

In all these cases, exact processing of the two quadrature components is possible only if the respective frequency components of the analog or digital quadrature-signal pair have precisely the same amplitudes and differ in phase by exactly 90°. In the low-IF method, in which the quadrature-signal pair is formed at the receiving end by analog quadrature mixing, hardly avoidable asymmetries in the two signal paths cause deviations which result in intolerable disturbances.

A remedy for this are correction circuits in which suitable detectors detect errors or interfering components in the respective amplitude and phase of the quadrature-signal pair and derive correction signals therefrom, so that the errors can be eliminated as far as possible. Such a correction circuit is described for analog quadrature-signal pairs in EP-A No. 122 657, corresponding to U.S. Pat. No. 4,633,315, for a low-IF conversion in which an RF television signal is converted to the baseband.

The transition from analog to digital signal processing is very advantageous for such quadrature-signal pairs because a large part of the asymmetries of the two signal paths, such as different aging rates, different influences of temperature, changes in alignment settings, and different internal or external interference- or useful-signal cross-coupling, is eliminated, and because digital technology permits the implementation of complicated filter and processing circuits which can hardly be realized in analog technology. However, the advantages resulting from the use of digital technology can only be achieved if the accuracy of the digital quadrature-signal pair meets more stringent requirements. Complicated correction circuits for this purpose can be implemented to advantage using digital technology. Such a digital correction circuit for phase and amplitude correction is disclosed, for example, in EP-A No. 237 590, corresponding to U.S. Pat. No. 4,799,212. The respective correction signals are added to and subtracted from the respective quadrature component by means of adders and subtracters, the respective correction signal being formed by multiplying one of the quadrature components by the associated correction factor, which is derived from the associated error signal by means of a control circuit.

The main problem in any correction circuit lies in the formation of the error signals. The determination of a deviation is relatively simple if, like in the composite color signal, the RF carrier, which also serves as a picture carrier, is transmitted with a defined amplitude during the horizontal synchronizing pulse in each picture line, and if for the burst signal, the RF carrier is modulated in each picture line with the chrominance subcarrier, whose amplitude and phase are precisely defined during this period. The quadrature-signal pair, which is defined by the burst signal, then represents a vector of constant length rotating at a constant frequency.

The picture-carrier wave during the synchronizing pulse and the chrominance-subcarrier wave during the burst signal can thus be used as a reference during low-IF conversion and color-signal processing, respectively. During low-IF conversion, the phase error, for example, can be determined by multiplying the in-phase signal by the quadrature signal, and the amplitude error by comparing (i.e., taking the difference of) the average amplitude square values of the in-phase and quadrature signals.

During the low-IF conversion of signals not transmitted by means of a carrier or subcarrier, however, this kind of error-signal formation is not possible since the resultant formed by the quadrature-signal pair is constantly modulated and at no time contains a defined reference quantity.

SUMMARY OF THE INVENTION

The present invention provides a correction circuit for digital quadrature-signal pairs which permits an accurate correction of the in-phase signal and the quadrature signal even if there is no unmodulated carrier or no easily detectable subcarrier in the original signal or in the quadrature-signal pair.

The invention is predicated on the recognition that an error-containing quadrature-signal pair u, v fed to an error-signal-forming circuit can be regarded as a rotating resultant in a polar representation which, when rotating at a sufficiently high frequency, describes an ellipse as a locus whose position relative to the origin in a coordinate system and axial ratio are determined by the errors of the quadrature-signal pair u, v. Without these errors, an exact circle would be obtained around the origin of the coordinate system. By determining characteristic locus errors, which is done by ascertaining the deviation of the actual elliptic locus from an ideal circle centered at the origin, the necessary error signals can be found, which, after passing through an associated controller, feed the respective correcting facilities of the in-phase- and quadrature-signal paths U, V.

The respective errors can also be compensated by systems without feedback However, a controller structure has the advantage that simpler systems, including nonlinear systems, can be used. The controllers generally contain a low-pass filter or an integrator for passing low frequencies and DC components as control signals while suppressing higher frequencies which are regarded as short-time or continuous disturbances.

BRIEF DESCRIPTION OF THE DRAWINGS

The invention will now be explained in greater detail with reference to the accompanying drawings, in which.

DETAILED DESCRIPTION OF THE PREFERRED EMBODIMENT

Figure 1:
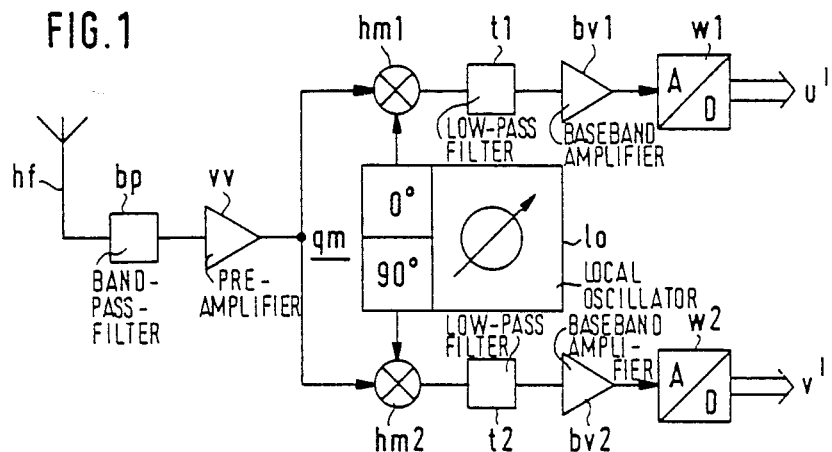
FIG. 1 is a block diagram of a conventional low-IF conversion circuit.

A low-IF conversion circuit shown schematically in FIG. 1 contains a quadrature mixer qm, which converts an RF signal hf coming from the antenna directly to the baseband, forming an analog quadrature-signal pair. A digital in-phase signal ("u-signal") u' and a digital quadrature-signal ("v-signal") v' are formed by means of a first A/D converter w1 and a second A/D converter w2, respectively. A system clock (not shown) controls the digitization in a conventional manner. The RF signal hf from the antenna is coarsely preselected by means of an RF band-pass filter bp and brought to a sufficient amplitude by means of a preamplifier vv, so that it can be converted to the baseband by means of the quadrature mixer qm with as little distortion as possible.

The quadrature mixer qm contains a first RF mixer hm1 and a second RF mixer hm2, whose signal inputs are connected to the output of the preamplifier vv. The carrier inputs of the two RF mixers are connected to the 0° output and the 90° output, respectively, of a local oscillator lo. The permissible harmonic content of the local oscillator lo depends on the quality of the preselection in the RF band-pass filter bp, which must be such that no mixer signals from undesired channels will get into the useful signal of the baseband. The same applies analogously to the linearity of the RF mixers hm1, hm2, which must be sufficiently good that no mixer-induced interfering frequencies will appear in the useful band. The output of the first RF mixer hm1 is passed through a first low-pass filter t1 and a first baseband amplifier bv1, a nd the output of the second RF mixer hm2 is passed through a second low-pass filter t2 and a second baseband amplifier bv2. The output of the first baseband amplifier bv1 and the output of the second baseband amplifier bv2 are the analog u-signal and the analog v-signal, respectively.

In the low-IF conversion process, the frequency of the local oscillator lo generally lies in the frequency range of the RF channel. The correction circuit according to the invention requires that the frequency of the local oscillator lo must be so located beside the frequency of the RF carrier that in the case of audio signals, for example, the frequency of the down-converted carrier is 10 kHz. This value is advantageous for FM stereo signals because any residual errors in gain and phase will, after demodulation, result in interfering signals at 20 kHz, which lie neither in the sum signal nor in the stereo difference signal.

Figure 2:
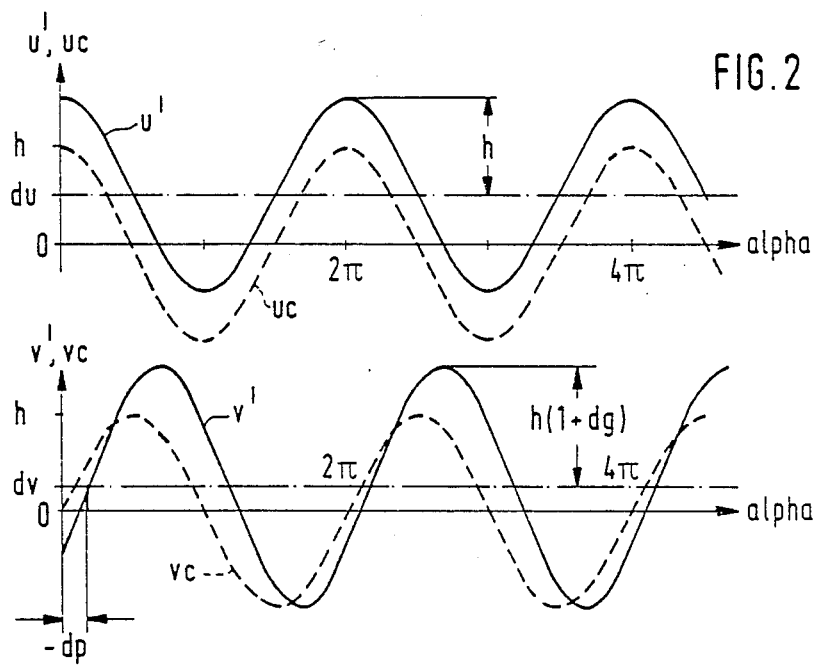
FIG. 2 is an analog representation of an error-containing cosine-/sine-shaped quadrature-signal pair showing the basic errors and the associated corrected quadrature-signal pair.

In FIG. 2, the uncorrected u-signal u' and the uncorrected v-signal v' (solid curves) as well as an associated corrected u-signal uc and an associated corrected v-signal vc (dashed curves) are plotted as a function of a phase angle alpha in an analog representation. The representation assumes that the absolute amplitude and the absolute phase of the uncorrected quadrature-signal pair u', v' are of no significance. Therefore, the phase error and the amplitude error can be referenced to the uncorrected u-signal u', which is thus regarded as a reference signal. Gain and phase errors then occur only in the uncorrected v-signal v'.

This simplifying, but fully valid approach will be retained in the following description. An approach in which the uncorrected v-signal v' would be regarded as a reference and in which the amplitude and phase correction would then relate only to the uncorrected u-signal u' would also be valid, of course. If coherent modulation is employed, both the uncorrected u-signal and the uncorrected v-signal may have a phase error and/or a gain error. Then, both the uncorrected u-signal u' and the uncorrected v-signal v' must be corrected in phase and amplitude by means of the correction circuit.

The errors shown in FIG. 2 are an in-phase offset error du in the uncorrected u-signal u'; a quadrature offset error dv in the uncorrected v-signal v'; a phase error dp in the uncorrected v-signal v'; and an amplitude error dg in the uncorrected v-signal v', which is actually due to a gain error. The reference character h denotes the desired amplitude of the u-signal and the v-signal, which is proportional to the amplitude of the RF carrier in the low-IF conversion method. The uncorrected v-signal v' with the amplitude error dg thus has the amplitude value h(1+dg), as shown.

The cause of the amplitude error dg is that the two local-oscillator signals have different levels and that the two RF mixers hm1, hm2, the two low-pass filters t1, t2, the two baseband amplifiers bv1, bv2, and the two A/D converters w1, w2 differ in their gains. The total gain error thus can easily cause an amplitude deviation of 10%.

The phase error dp is mainly due to the fact that the phase difference between the two signals from the local oscillator lo is not exactly 90°.

The offset errors du, dv are caused by the A/D converters and the DC-coupled stages before the digitization. But even if AC-coupled stages are used, offset like errors require attention. An alternating-current amplifier having a very low cutoff frequency can be regarded as a direct-current amplifier from whose output the low-frequency components, which are suppressed by the alternating-voltage amplifier but are present in the signal, are subtracted. This corresponds to the addition of a signal-dependent, slowly time-varying offset voltage. Thus, the alternating-voltage amplifiers, which are necessary because of the high gain, also influence the offset errors du, dv.

In FIG. 2, the phase error −dp is shown as the value by which the uncorrected v-signal v' lags the corrected v-signal vc. Since the uncorrected u-signal u' and the corrected u-signal uc are shown as cosine-wave signals, the corrected v-signal vc is sinusoidal.

Unlike in systems processing demodulated signals, in systems involving low-IF conversion of angle-modulated signals, all errors mentioned here, even offset errors, in the most general case result in nonlinear distortions of the demodulated signal. By suitable choice of the frequency of the local oscillator lo, a constant interference signal can be shifted to a noninterfering range outside the useful signal. Distortions during the transmission of a useful signal are not reduced, however. A remedy can thus be provided only by correcting the error-containing quadrature-signal pair u', v'.

In digitized arrangements, the error measurement proper should always be performed after the A/D converters, so that the errors of the latter will also be corrected. The correction can be performed either before the A/D converters by analog devices or after the A/D converters by digital devices.

Analog correction, however, would require a D/A conversion of the respective correcting or control signals; this is avoided in a digital correction system. The following considerations thus refer to digital correcting facilities, which are implemented with adders and multipliers in particular. It is advantageous to use the two's complement code for the data or signals fed to the digital correcting facilities.

The uncorrected quadrature-signal pair u', v' of FIG. 2 can be described by the following equations (1) and (2):

$$u' = h \times \cos(\alpha lpha) + du \quad (1)$$

$$v' = h(1+dg)\sin(\alpha lpha + dp) + dv \quad (2)$$

where:
alpha = the time-dependent phase, which contains the actual modulation in FM signals;
h > 0 = desired amplitude of the u-signal and the v-signal, as described; and
du, dv, dp and dg = the quadrature-signal errors described above.

Figure 3:
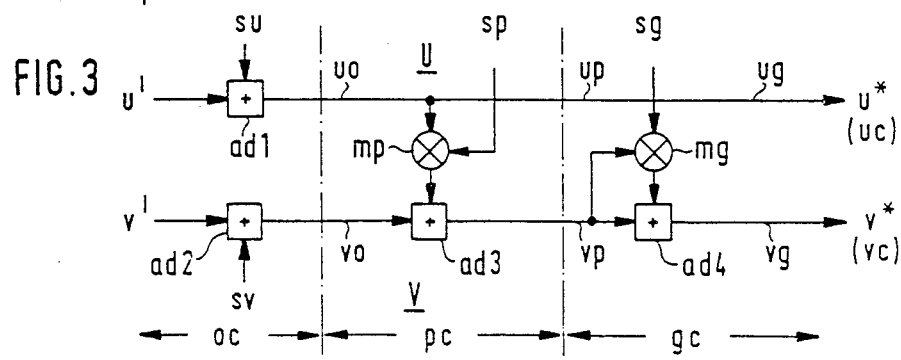
FIG. 3 is a block diagram of an embodiment of the correcting facilities in the in-phase signal and quadrature-signal paths.

FIG. 3 shows schematically ideal correcting facilities which can eliminate all quadrature-signal errors if suitable correcting signals are applied to it. The quadrature-signal pair u*, v* appearing at the output of the ideal correcting facilities is then the desired, fully corrected quadrature-signal pair uc, uv.

To completely eliminate the quadrature signal errors shown in FIG. 2, the following correcting signals are necessary, which can be derived from equations (1) and (2):
an in-phase-offset-correcting signal (i.e., a u-correcting signal) su, where:

$$su = -du;$$

a quadrature-offset-correcting signal (i.e., a v-correcting signal) sv, where:

$$sv = -dv;$$

a phase-correcting signal sp, where:

$$sp = -(1+dg)\sin(dp); \text{ and}$$

an amplitude-correcting signal sg, where:

$$sg = -1 + \{1/(1+dg)\}\cos(dp).$$

Exemplary conventional methods for correcting the quadrature-signal pair u', v':
use the DC component of the uncorrected u-signal u' to correct the in-phase offset error du;
use the DC component of the uncorrected v-signal v' to correct the quadrature offset error dv;
use the DC component of the product obtained by the multiplication together of the uncorrected quadrature-signal pair to correct the phase error dp; and
use the DC components of the terms $u'^2 - v'^2$ or $|u'| - |v'|$, formed from the uncorrected quadrature-signal pair u', v' to correct the amplitude error dg.

In each of the associated trigonometric functions, the DC components of these terms form an addend which represents an odd function of the error to be corrected and which, in a control system, influences the respective correcting signal su, sv, sp, sg in the correct sense. Although such systems operate properly with an unmodulated carrier, in the above terms, modulation of the carrier may result in additional DC components which are superimposed on the DC components determined by the quadrature errors and lead to a malfunction of the correction circuit, which, in the worst case, increases the quadrature-signal errors instead of reducing them. If, during low-IF conversion, a spectral line from the frequency spectrum of the channel to be converted is transformed directly down to 0 Hz, this spectral line will appear as a DC component in the baseband (i.e., also in the uncorrected quadrature-signal pair u', v'), and will be falsely corrected by an offset-correcting stage (described below) like an offset error.

The correction system underlying the invention uses, instead of the above-mentioned terms, suitably chosen values of the quadrature-signal pair which have an essential advantage in that they are independent of the angle modulation. This will now be explained with the aid of FIGS. 4a–4e.

In the foregoing, the quadrature-signal errors were referred to the uncorrected quadrature-signal pair u', v', which can be obtained directly from the outputs of the first and second A/D converters w1, w2. The subsequent correction circuit of FIG. 3 comprises an in-phase-signal path U and a quadrature-signal path V with an offset-correcting stage oc, a phase-correcting stage pc, and an amplitude-correcting stage gc, in which the uncorrected quadrature-signal pair u', v' is modified. At the output, the quadrature-signal pair u*, v* is made available for further processing. According to the corrective action, this signal pair can be either the desired corrected quadrature-signal pair uc, vc or a quadrature-signal pair with residual or unchanged quadrature-signal errors. The following description assumes that the signal obtained from the quadrature-pair signal path U, V is the quadrature-signal pair u, v with the quadrature-signal errors contained therein.

Figure 4A:
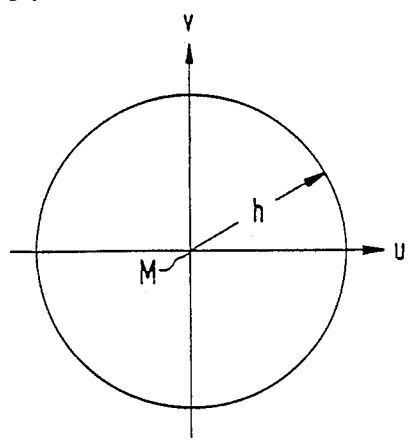
FIGS. 4a–4e are analog representations showing the effects of the quadrature-signal errors illustrated in FIG. 2 on the resultant.

If the two components of the quadrature-signal pair u, v are interpreted as Cartesian coordinates of a resultant, and there is no quadrature-signal error, the locus of the resultant will be a circle of radius h having a center M which is identical with the origin of the coordinate system, as shown in FIG. 4a. Offset errors du, dv result in a displacement of the center M from the origin, but the locus remains a circle, as shown in FIG. 4b, where h=1.

Figure 4C:
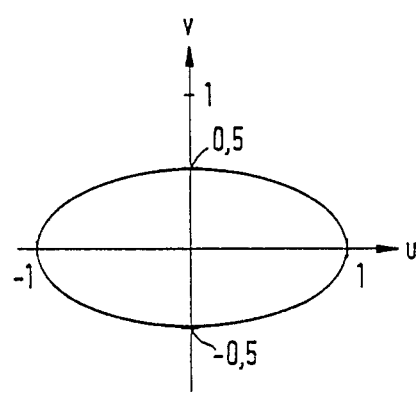
Figure 4B:
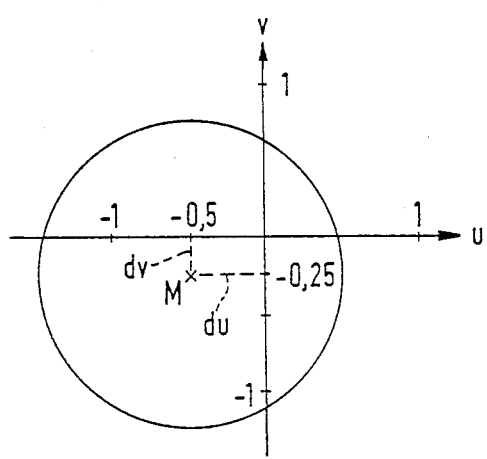

The amplitude error dg results in an elliptical form of the locus, as shown in FIG. 4c, in which the v-amplitude is only half the u-amplitude normalized to 1.

Figure 4D:
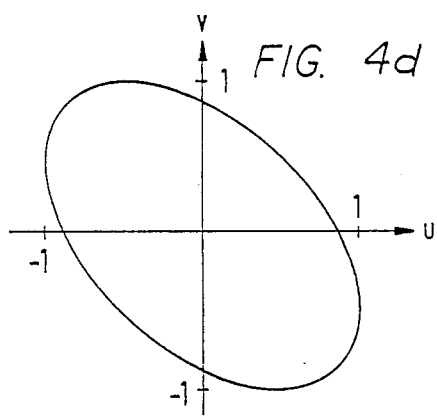

The phase error dp also results in an elliptical locus, but the axes of this ellipse are rotated with respect to the coordinate system. In addition to rotating the axes, the phase error changes their lengths, as shown in FIG. 4d.

Figure 4E:
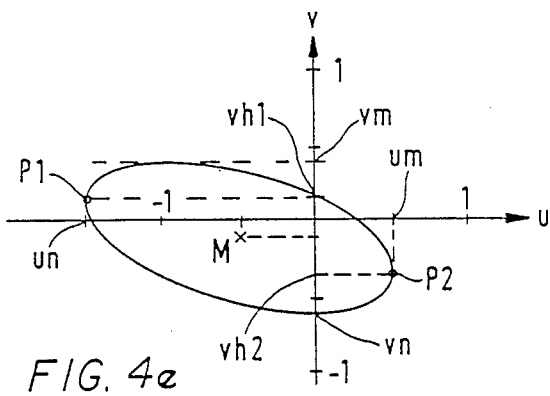

If all types of errors are present simultaneously, these effects will be superimposed on each other. All these errors are shown in FIG. 4e, where the u-amplitude h is normalized to the value 1. The center M of the rotated ellipse is located at the coordinate values u=−0.5 and v=−0.125. The extreme values with respect to the two coordinates u, v are:

an in-phase maximum value ("u-max value") um;
an in-phase minimum value ("u-min value") un;
a quadrature maximum value ("v-max value") vm; and
a quadrature minimum value ("v-min value") vn.

Also shown are a point P1 of the locus, at which the u-min value un occurs, and a point P2, at which the u-max value um occurs. The v-values belonging thereto are the first and second held quadrature values ("held v-values") vh1 and vh2, respectively.

From these specific locus values of FIG. 4e, the following quantities can be determined for the two equations (1) and (2) by transformation:

$$un = -h + du \quad (3)$$

$$um = h + du \quad (4)$$

$$vn = -h(1+dg) + dv \quad (5)$$

$$vm = h(1+dg) + dv \quad (6)$$

$$vh1 = -h(1+dg)\sin(dp) + dv \quad (7)$$

$$vh2 = h(1+dg)\sin(dp) + dv \quad (8)$$

Suitable combinations of these equations give the following equations:

$$un + um = 2du \quad (9)$$

$$vn + vm = 2dv \quad (10)$$

$$vh2 - vh1 = 2h(1+dg)\sin(dp) \quad (11)$$

$$vm - vn - (um - un) = 2hdg \quad (12)$$

The Equations (9)-(12) are the four conditional equations for the four quadrature-signal errors specified above. They each represent an odd function of the errors to be compensated. As signals in an automatic control system, these terms can therefore produce such correcting signals su, sv, sp, sg that the errors of the quadrature-signal pair u, v will be corrected with the correcting facilities described. The structure of the controllers to generate these correction signals is not of primary interest in this connection.

The locus must be described a sufficient number of times to obtain reliable estimates of the characteristic values of the locus. This can be forced by a sufficiently high frequency offset of the local oscillator lo with respect to the carrier frequency. Angle modulation does not influence the position of the locus.

The correcting signals generated by means of the controllers feed the correcting facilities shown in FIG. 3. In the offset-correcting stage oc, the in-phase-offset-correcting signal ("u-correcting signal") su and the quadrature-offset-correcting signal ("v-correcting signal") sv are applied to one input of a first adder ad1 and to one input of a second adder ad2, respectively. The other inputs of the first adder ad1 and the second adder ad2 are fed with the uncorrected u-signal u' and the uncorrected v-signal v', respectively.

The phase-correcting signal sp is applied to one input of a first multiplier mp, whose other input is connected to the output of the first adder ad1. The output of the first multiplier mp is coupled to one input of a third adder ad3, whose other input is connected to the output of the second adder ad2. The phase-correcting stage pc thus follows the offset-correcting stage oc in the direction of signal flow.

The last stage in FIG. 3 is the amplitude-correcting stage gc, comprising a second multiplier mg and a fourth adder ad4. One input of the fourth adder ad4 is connected to the output of the second multiplier mg. The other input of the fourth adder ad4 and one input of the second multiplier mg are connected to the output of the third adder ad3, and the other input of the second multiplier mg is fed with the amplitude-correcting signal sg.

The output of the first adder ad1 is an offset-corrected u-signal uo which passes through the phase-correcting stage pc and amplitude-correcting stage gc unchanged. Thus, in the embodiment shown in FIG. 3, the signals uo, up and us are the same signal.

In the arrangement shown in FIG. 3, the outputs of the offset-correcting stage oc are the offset-corrected u-signal uo and an offset-corrected v-signal vo; the outputs of the phase-correcting stage pc are the phase-corrected u-signal up and the phase-corrected v-signal vp, which are also offset-corrected; and the outputs of the amplitude-correcting stage gc are an amplitude-corrected u-signal ug and an amplitude-corrected v-signal vg, which is also offset-corrected and phase-corrected. In the respective correcting facilities, the correcting signal is zero when no error is present, and if the correcting signal is set to zero, the respective correcting facility will become ineffective and pass the respective quadrature-signal pair unchanged.

Figure 5:
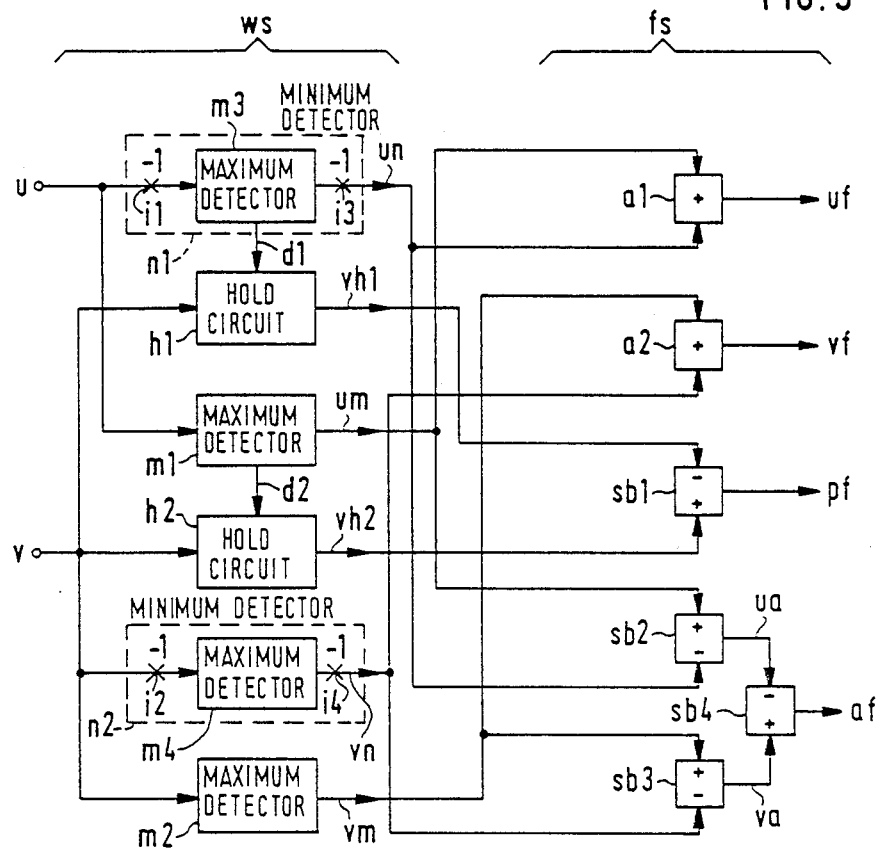
FIG. 5 is a block diagram of an embodiment of the value-determining and error-detecting stages.

FIG. 5 shows in a block diagram how a value-determining stage ws and an error-detecting stage fs derive the individual error signals from the characteristic values of the locus in accordance with equations (9) to (12). The u-signal u is applied to the inputs of a first minimum detector n1 and a first maximum detector m1, whose outputs are the u-min value un and the u-max value um, respectively.

The v-signal v is applied to the input of a first hold circuit h1, whose control input is driven by a first detector signal d1 and whose output is the first held v-value vh1. The v-signal v is also applied to the input of a second hold circuit h2, whose control input is driven by a second detector signal d2 and whose output is the second held v-value vh2. The first and second detector signals d1, d2 come from the first minimum detector n1 and the first maximum detector m1, respectively. The v-signal v is also fed to a second minimum detector n2 and a second maximum detector m2, whose outputs are a v-min value vn and a v-max value vm, respectively.

As shown in dashed lines in FIG. 5, the first minimum detector n1 and the second minimum detector n2 can be designed as a third maximum detector m3 and a fourth maximum detector m4, respectively. In such a configuration, the signal input of the third maximum detector m3 is fed with the u-signal u via a first inverter i1 and the signal input of the fourth maximum detector m4 is fed with the v-signal v via a second inverter i2. The output of the third maximum detector m3 is passed through a third inverter i3 and the output of the fourth maximum detector m4 is passed through a fourth inverter i4. Logical inversion occurs in each of the inverters i1, i2, i3 and i4.

In the error-detecting stage fs of FIG. 5, an in-phase offset error signal ("u-offset signal") uf is formed from the u-min value un and the u-max value um by means of a first adder a1. A quadrature offset error signal ("v-offset signal") vf is formed from the v-min value vn and the v-max value vm by means of a second adder a2. A first subtracter sb1 has a minuend input and a subtrahend input which are fed with the second held v-value vh2 and the first held v-value vh1, respectively. The output of the first subtracter sb1 delivers a phase-error signal pf.

The error-detecting stage fs further includes a second subtracter sb2, a third subtracter sb3 and a fourth subtracter sb4. The second subtracter sb2 has a minuend input and a subtrahend input which are fed with the u-max value um and the u-min value un, respectively. The output of the second subtracter sb2 produces an in-phase amplitude value ("u-amplitude value") ua. The third subtracter sb3 has a minuend input and a subtrahend input which are fed with the v-max value vm and the v-min value vn, respectively. The output of the third subtracter sb3 produces a quadrature amplitude value ("v-amplitude value") va. The fourth subtracter sb4 has a minuend input and a subtrahend input which are fed with the v-amplitude value va and the u-amplitude value ua, respectively. The output of the fourth subtracter sb4 produces an amplitude-error signal af.

The above-described subtracters can be replaced by adders, in which case the signal applied to the respective subtrahend input must be logically inverted by means of an inverter.

The u-offset signal uf corresponds to the term 2du of the Equation (9). The v-offset signal vf corresponds to the term 2dv of the Equation (10). The phase-error signal pf corresponds to the term $2h(1+dg)\sin(dp)$ of the Equation (11). The amplitude-error signal af corresponds to the term 2hdg of the Equation (12).

Figure 6:
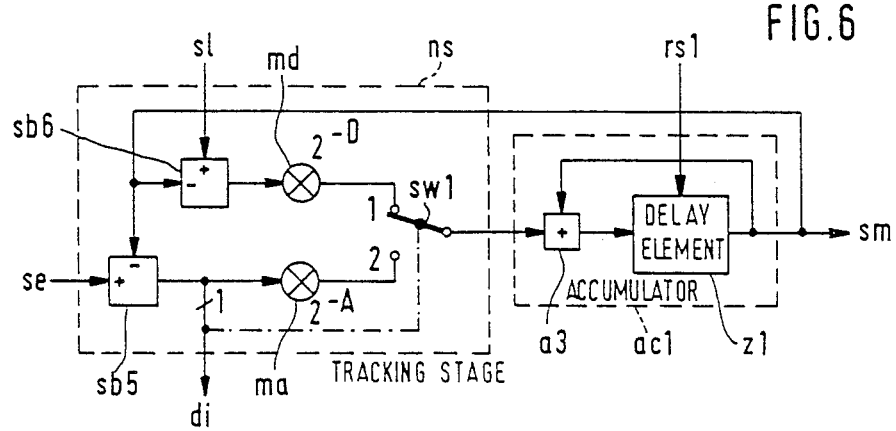
FIG. 6 is a block diagram of an embodiment of the maximum detector.

FIG. 6 shows a block diagram of a preferred embodiment of a maximum detector such as may be used in FIG. 5. The maximum detector comprises a tracking stage ns and a first accumulator ac1, each of which is bounded in broken lines. The tracking stage ns comprises a fifth subtracter sb5, a sixth subtracter sb6, a first constant multiplier ma, a second constant multiplier md and an electronic switch sw1. An input signal se is applied to the minuend input of the fifth subtracter sb5. The subtrahend input of the fifth subtracter sb5 is connected to the subtrahend input of the sixth subtracter sb6 and to the output of the maximum detector. The output of the maximum detector delivers a maximum value sm to be determined. The outputs of the fifth and sixth subtracters sb5, sb6 feed the first constant multiplier ma and the second constant multiplier md, respectively, whose outputs are applied to a second input 2 and a first input 1, respectively, of the electronic switch sw1.

The output of the fifth subtracter sb5 is also a detector signal di, which, in the simplest case, is the sign bit of the output signal. Depending on the sign, the first electronic switch sw1 is placed in the first position 1 or the second position 2. For the third maximum detector m3 or the first maximum detector m1 in FIG. 5, the detector signal di also serves to drive the first or second hold circuit h1, h2.

The output of the tracking stage ns is the output of the first electronic switch sw1. The output of the tracking stage ns tracks the maximum values of the input signal in a manner similar to that of an analog peak detector. The attack time and the decay time, respectively, are determined by means of the first and second constant multipliers ma, md. The minuend input of the sixth subtracter sb6 is fed with a preset value s1, which is necessary to prevent the slowly decaying tracking signal from sticking at the value 0 (zero) when the maximum values of the input signal se lie in the negative range.

The two constant multipliers ma, md only cause an arithmetic shift of the applied signals toward lower values (i.e., an attenuation by powers of two). In the second constant multiplier md, this attenuation $(2^{-D})$ is considerably greater than the attenuation $(2^{-A})$ in the first constant multiplier ma, so that the decay time is much longer than the attack time.

The output of the tracking stage ns feeds the data input of the first accumulator ac1, which comprises a third adder a3 and a first delay element z1. After a few rotations of the locus, the maximum value sm to be determined thus builds up in the delay element z1. The latter can be placed in a defined initial state by means of a first reset signal rs1.

The advantage of the described maximum detector lies in the fact that short-time interference signals are averaged out and have only little effect on the formation of the maximum value. Another advantage is that in case of a prolonged disturbance, the correct maximum value sm will be found again even if the value stored in the delay element z1 is too high, because as a result of the slowly decaying tracking, the correct maximum value is achieved again after some time.

Figure 7:
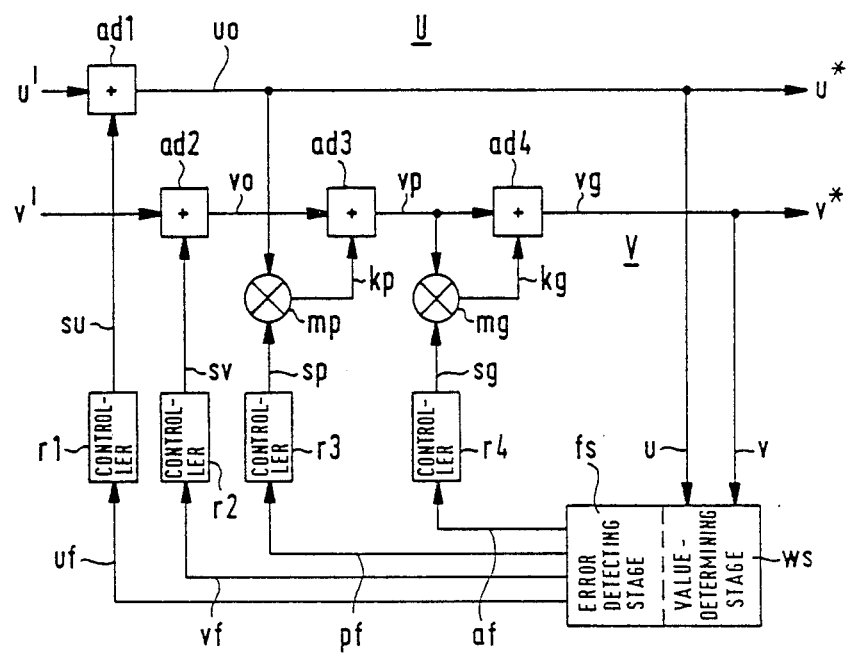
FIG. 7 is a block diagram of an embodiment of the correction circuit according to the invention.

FIG. 7 shows an embodiment of the complete correction circuit in a block diagram. The correcting facilities in the in-phase-signal and quadrature-signal paths U, V are identical with those of FIG. 3. They form part of a control circuit in which the quadrature-output-signal pair u*, v* is fed as the u-signal u and v-signal v to the value-determining stage ws, which derives the associated error signals therefrom by means of the error-detecting stage fs. The u-offset signal uf and the v-offset signal vf are fed to a first controller r1 and a second controller r2, respectively, whose outputs are the u-correcting signal su and the v-correcting signal sv, respectively. The phase-error signal pf is fed to a third controller r3, whose output is the phase-correcting signal sp. The amplitude-error signal af is fed to a fourth controller r4, whose output is the amplitude-correcting signal sg.

The outputs of the first multiplier mp and the second multiplier mg are a phase-correcting value kp and an amplitude-correcting value kg, which are applied to one input of the third adder ad3 and to one input of the fourth adder ad4, respectively. The phase-correcting and amplitude-correcting values kp, kg and the associated phase-correcting and amplitude-correcting signals sp, sg assume the value 0 (zero) when no phase or amplitude error is present in the quadrature-signal pair u, v.

A variant of the amplitude-correcting stage gc dispenses with the fourth adder ad4 if instead of the latter the second multiplier mg is inserted directly into the v-signal path. Without an amplitude error, the value of the amplitude-correcting signal sg is then 1.

Figure 8:
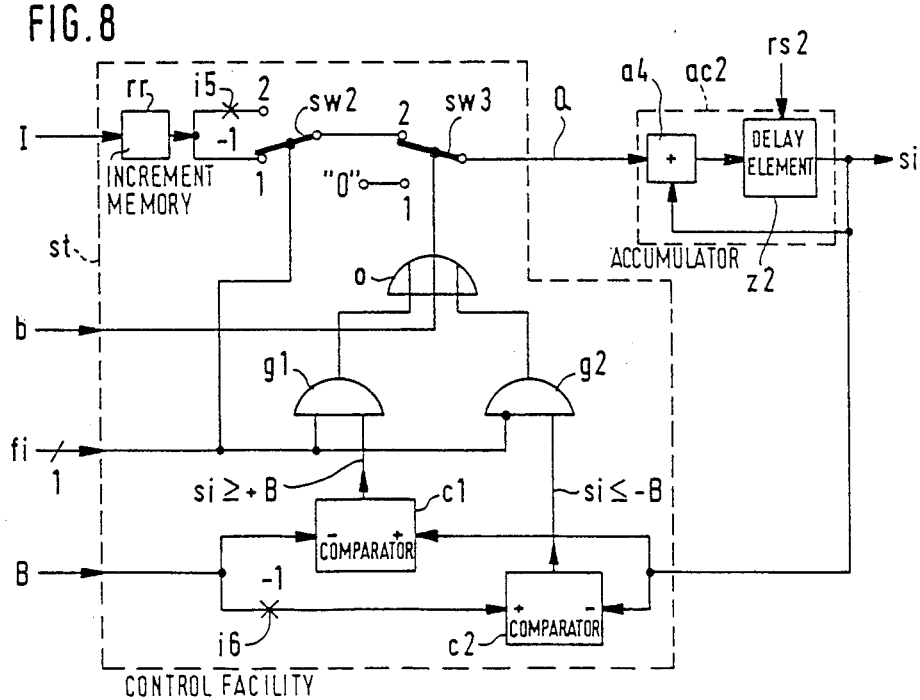
FIG. 8 is a block diagram of an embodiment of a nonlinear controller.

FIG. 8 shows schematically an embodiment of a nonlinear controller which can be used to advantage in the circuit arrangement of FIG. 7. The controller comprises a control facility st and a second accumulator ac2, both of which are bounded in broken lines in FIG. 8. In this controller, the contents of a memory array, implemented by the second accumulator ac2, are increased or decreased by the value of an increment Q depending on the sign of an error signal fi. Different values of the increment Q can be chosen by reading the increment out of an increment memory rr as addressed by an address word I. The output of the memory array (i.e., the second accumulator ac2) provides a correcting signal si. To keep the correcting signal si formed by the memory array within a reasonable range of values, the signal is compared with an externally applied range limit word B and, when exceeding the range, held in its value. In the simplest case, the increment Q will be a power of two (e.g., $Q = \pm 2^{-6}$), which is small compared with the range of numbers from $-1$ to $+1$, a range which is commonly used in the audio range.

The holding of the correcting signal si is also achieved by a blocking signal b, whereby the state of the respective controller remains "frozen." This blocking may be advantageous on the occurrence of interference signals to prevent the correcting signal si from drifting. On the other hand, the freezing of the control state by the blocking signal b also permits a simple inspection of the controller action, because the correcting signal si can be transferred out over a data bus (not shown), for example.

In the embodiment of FIG. 8, the sign bit of the error signal fi is fed to the control input of a second electronic switch sw2. The first input 1 of the second electronic switch sw2 is connected directly to the output of the increment memory rr, while its second input 2 is connected to the output of the increment memory rr via a fifth inverter i5. If the error signal fi is greater than or equal to zero, the switching contact is connected to the input 2, so that the correcting signal si will be reduced. If the error signal fi is less than zero, the switching contact will be connected to the input 1, so that the correcting signal si will be increased.

The output of the second electronic switch sw2 is coupled to the second input 2 of a third electronic switch sw3, whose first input 1 is fed with a data word "0" (zero). The memory array is implemented, for example, with the second accumulator ac2. The second accumulator ac2 comprises a fourth adder a4 and a second delay element z2. The second delay element z2 can be cleared (i.e., placed in a defined initial state) by means of a second reset signal rs2. The contents of the memory array (i.e., the second accumulator ac2) can be changed in value by means of the two electronic switches sw2, sw3. The "freezing" of the memory contents is also possible, as discussed below.

The control facility st further includes a logic circuit formed by two comparators c1, c2, an OR-gate o, an AND-gate g1 and an AND-gate g2. The logic circuit generates the control signal for the third electronic switch sw3. The logic circuit places the third electronic switch sw3 in the position 1 only if: (1) the error signal fi is less than zero and the correcting signal si is greater than or equal to the positive extreme value of the applied range-limit word B; or (2) the error signal fi is greater than or equal to zero and the correcting signal si is less than or equal to the negative extreme value of the applied range-limit word B; or (3) a positive blocking signal b forces the switch sw3 to assume the position 1, as shown in the function table below.

The range-limit word B is fed directly to the subtrahend input of the first comparator c1 and is fed indirectly to the minuend input of the second comparator c2 through a sixth inverter i6. The minuend input of the first comparator c1 and the subtrahend input of the second comparator c2 are fed with the correcting signal si. The first comparator c1 produces a logic 1 if si is greater than or equal to $+B$, and the second comparator produces a logic 1 if si is less or equal to $-B$.

The minuend-greater-than-or-equal-to-subtrahend output of the first comparator c1 is coupled to one input of the first AND-gate g1, whose other input is fed with the sign bit of the error signal fi.

The subtrahend-less-than-or-equal-to-minuend output of the second comparator c2 is connected to one input of the second AND-gate g2, whose second input is an inverting input which is fed directly with the sign bit of the error signal fi. The output of each of the two AND-gates g1, g2 is coupled to a respective input of the OR-gate o. The third input of the OR-gate o is fed with the blocking signal b. The output of the OR-gate o is coupled to the control input of the third electronic switch sw3. The switching contact of the third electronic switch sw3 will be connected to the input 1 when at least one of the three inputs of the OR-gate o is at logic 1.

The output of the third electronic switch sw3 is the output of the control facility st. It provides the increment Q as a positive, negative or zero value to the input of the second accumulator ac2 in order to increase or decrease the contents of the latter. The value of the increment Q is small compared with that of the correcting signal si. As mentioned, during digital signal processing, the range of numbers from $-1$ to $+1$ is commonly used for signal levels in the audio range, with the number of bits required after the binary point corresponding to the maximum possible resolution.

If, for example, the address word I has two bits, it can be used to call up four different values for the increment Q (e.g., $Q = 2^{-13}, 2^{-14}, 2^{-15}, 2^{-16}$), which are fed to the accumulator ac2. The correcting signal si, which can be varied over the range from $+1$ to $-1$, is limited by the range-limit word B to a narrower range of values (e.g., to a range of $-2^{-2}$ through $+2^{-2}$).

The following is a function table for forming the values for the increment Q based upon the values for si, fi, B, and b:

Function Table for Forming the Increment Q

|  | fi < 0 | fi < 0 | |
|---|---|---|---|
|  | si ≤ −B | −B < si < +B | si ≥ +B |
| fi < 0, b = 0 | Q > 0 | Q > 0 | Q = 0 |
| fi ≥ 0, b = 0 | Q = 0 | Q < 0 | Q < 0 |
| fi arbitrary, b = 1 | Q = 0 | Q = 0 | Q = 0 |

What is claimed is:

1. A correction circuit for a digital signal pair having an uncorrecting in-phase signal and an uncorrecting quadrature signal, comprising:
   an offset-correcting stage that receives said uncorrected in-phase signal and said uncorrected quadrature signal and that generates an offset-corrected in-phase signal and an offset-corrected quadrature signal, said offset-correcting stage further receiving an in-phase-offset-correcting signal and a quadrature-offset-correcting signal;

a phase-correcting stage that receives said offset-corrected in-phase signal and said offset-corrected quadrature signal and that generates an phase-corrected quadrature signal, said phase-correcting stage further receiving a phase-correcting signal;

an amplitude-correcting stage that receives said phase-corrected quadrature signal and that generates an amplitude-corrected quadrature signal, said amplitude-correcting stage further receiving an amplitude-correcting signal;

a value-determining stage comprising:
  a first minimum detector that receives said offset-corrected in-phase signal and that generates an in-phase minimum value;
  a first maximum detector that receives said offset-corrected in-phase signal and generates an in-phase maximum value;
  a second minimum detector that receives said amplitude-corrected quadrature signal and generates a quadrature minimum value;
  a second maximum detector that receives said amplitude-corrected quadrature signal and that generates a quadrature maximum value;
  a first hold circuit that receives said amplitude-corrected quadrature signal, said first hold circuit responsive to said first minimum detector to store a first held quadrature value on the occurrence of said in-phase minimum value;
  a second hold circuit that receives said amplitude-corrected quadrature signal, said second hold circuit responsive to said first maximum detector to store a second held quadrature value on the occurrence of said in-phase maximum value;

an error-detecting stage comprising:
  a first adder that receives said in-phase maximum value from said first maximum detector and said in-phase minimum value from said first minimum detector, said first adder generating an in-phase offset error signal;
  a second adder that receives said quadrature maximum value from said second maximum detector and said quadrature minimum value from said second minimum detector, said second adder generating a quadrature offset error signal;
  a first subtracter having a minuend input that receives said second held quadrature value and having a subtrahend input that receives said first held quadrature value, said first subtracter generating a phase-error signal;
  a second subtracter having a minuend input that receives said in-phase maximum value from said first maximum detector and having a subtrahend input that receives said in-phase minimum value from said first minimum detector, said second subtracter generating an in-phase amplitude value;
  a third subtracter having a minuend input that receives said quadrature maximum value from said second maximum detector and having a subtrahend input that receives said quadrature minimum value from said second minimum detector, said third subtracter generating a quadrature amplitude value; and
  a fourth substrater used as an amplitude comparator, said fourth subtracter having a minuend input that receives said quadrature amplitude value from said third subtracter and having a subtrahend input that receives said in-phase amplitude value from said second subtracter, said fourth subtracter generating an amplitude error signal; and a first controller that receives said in-phase offset signal from said first adder and that generates said in-phase offset-correcting signal received by said offset-correcting stage;

a second controller that receives said quadrature offset error signal from said second adder and that generates said quadrature offset-correcting signal received by said offset-correcting stage;

a third controller that receives said phase-error signal generated by said first subtracter and that generates said phase-correcting signal received by said phase-correcting stage; and a fourth controller that receives said amplitude-error signal generated by said fourth subtracter and that generates said amplitude-correcting signal received by said amplitude-correcting stage.

2. A correction circuit as defined in claim 1, wherein:
said first minimum detector comprises a third maximum detector, a first inverter and a second inverter, said third maximum detector having a signal input that receives said offset-corrected in-phase signal via said first inverter, said third maximum detector providing said in-phase minimum value as an output via said second inverter; and
said second minimum detector comprises a fourth maximum detector, a third inverter and a fourth inverter, said fourth maximum detector having a signal input that receives said amplitude-corrected quadrature signal via said second inverter, said fourth maximum detector providing said quadrature minimum value as an output via said fourth inverter.

3. A correction circuit as defined in claim 1, wherein at least one of said first and second maximum detectors comprises:
  a memory for storing a maximum value, said memory being resettable to an initial value via a first reset signal;
  a tracking stage comprising:
    a fifth subtracter having a subtrahend input which receives said maximum value stored by said memory and having a minuend input that receives an input signal corresponding to the signal whose maximum value is being detected, said fifth subtracter providing an output signal having a sign bit that changes when said input signal increases to a value greater than said stored maximum value;
    a sixth subtracter having a subtrahend input which receives said maximum value stored by said memory and having a minuend input that receives a preset value;
    a first constant multiplier that receives the output of said fifth subtracter and multiplies said output by a first constant value;
    a second constant multiplier that receives the output of said sixth subtracter and multiplies said output by a second constant value; and
    a first electronic switch having first and second inputs and an output, said first input connected to the output of said second constant multiplier and said second input connected to the output of said first constant multiplier, said first electronic switch having a first position in which said first input of said first electronic switch is connected to said output of said first electronic switch and having a second position in which said second input of said first electronic switch is connected to said output of said first electronic switch, said first electronic switch responsive to the output signal of said fifth subtracter to assume said first position when the output signal of said fifth subtracter is less than zero and to assume said second position when the output signal of said fifth subtracter is greater than or equal to zero, said sign bit of the output signal of said fifth subtracter being said detector signal.

4. A correction circuit as defined in claim 3, wherein said memory for storing a maximum value comprises a first accumulator, said first accumulator comprising:
- a first delay element having an input and an output, and having a reset input that receives a first reset signal, said first delay element being initialized to an initial value when said first reset signal is active, said output of said first delay element providing said maximum value; and
- a third adder having first and second inputs and an output, said first input being connected to the output of said first electronic switch, and said second input being connected to the output of the first delay element, said output of said output of said third adder being connected to said input of said delay element.

5. A correction circuit as defined in claim 1, wherein said offset-correcting stage comprises:
- a first offset-correcting stage adder having a first input that receives said uncorrected in-phase signal and having a second input that receives said in-phase-offset-correcting signal, said first offset-correcting stage adder having an output that provides said offset-corrected in-phase signal; and
- a second offset-correcting stage adder having a first input that receives said uncorrected quadrature signal and having a second input that receives said quadrature-offset-correcting signal, said second offset-correcting stage adder having an output that provides said offset-corrected quadrature signal.

6. A correction circuit as defined in claim 1, wherein said phase-correcting stage comprises:
- a phase-correcting stage multiplier having a first input that receives said offset-corrected in-phase signal, having a second input that receives said offset-corrected quadrature signal, and having an output that generates an output signal;
- a phase-correcting stage adder having a first input that receives said offset-corrected quadrature signal, having a second input that receives said output signal from said phase-correcting stage multiplier and having an output that generates said phase-corrected quadrature signal.

7. A correction circuit as defined in claim 1, wherein said amplitude-correcting stage comprises:
- an amplitude-correcting stage multiplier having a first input that receives said phase-corrected quadrature signal from said phase-correcting stage, having a second input that receives said amplitude-correcting signal from said fourth controller and having an output that generates an output signal; and
- a fourth adder having a first input that receives said phase-corrected quadrature signal, having a second input that receives said output signal from said amplitude-correcting stage multiplier and having an output that generates said amplitude-corrected quadrature signal.

8. A correction circuit as defined in claim 1, wherein at least one of said first, second, third and fourth controllers comprises:
- a control facility having a first input that receives a respective error signal, a second input that receives a blocking signal, a third input that receives an address word, a fourth input that receives a range-limit word, a fifth input that receives a respective correcting signal from the output of said controller, and an output; and
- a second accumulator having a data input connected to said output of said control facility and having a reset input by which said accumulator can be initialized to a predetermined value in response to a second reset signal, said second accumulator storing a value that represents said respective correcting signal, said second accumulator having an output that provides said value as said respective correcting signal output from said respective controller.

9. A correction circuit as defined in claim 8, wherein said control facility comprises:
- an increment memory having a plurality of data values stored therein, said increment memory addressable by said address word and providing one of said data values as an increment memory output value;
- a first correction circuit inverter having an input that receives said increment memory output value and having an output that provides an inverted increment memory output value;
- a second electronic switch having a first input and a second input, said first input connected to receive said increment memory output value from said increment memory, said second input connected to receive said inverted increment memory output value from said increment memory data inverter, said second electronic switch selecting one of said first and second inputs in response to the sign of said error signal;
- a second correction circuit inverter having an input that receives said range-limit and having an output that provides an inverted range-limit word;
- a first comparator having a subtrahend input that receives said range-limit word directly from said fourth input, having a minuend input that receives said respective correcting signal from said second accumulator, and having an output that provides an output signal; and
- a second comparator having a minuend input that receives said inverted range-limit word from said second correction circuit inverter, having a subtrahend input that receives said output signal from said second accumulator, and having an output that provides an output signal;
- a first AND-gate having a first input that receives said error signal, having a second input that receives said output from said first comparator, and having an output that provides an output signal;
- a second AND-gate having an inverting first input that receives said error signal, having a second input that receives said output from said second comparator, and having an output that provides an output signal;

an OR-gate having a first input that receives said blocking signal, having a second input that receives said output signal from said first AND-gate, having a third input that receives said output signal from said second AND-gate, and having an output that generates an output signal; and a third electronic switch having a first input that receives a data value of 0, having a second input that receives said output signal from said second accumulator, and having an output that is connected to the data input of said second accumulator, said third electronic switch further having a control input that receives said output signal from said OR-gate, said output signal from said OR-gate controlling the selection of said first input or second input by said third electronic switch.

10. A correction circuit as defined in claim 1, further including a low-IF conversion circuit that provides said digital signal pair from an input signal having a carrier frequency, said low-IF conversion circuit comprising:

a first RF mixer that provides said uncorrected in-phase signal;

a second RF mixer that provides said uncorrected quadrature signal; and a local oscillator that generates a 0° signal that drives said first RF mixer and a 90° signal that drives said second RF mixer, said 0° signal and said 90° signal generated by said local oscillator having a frequency that lies in the useful band of the RF signal and is separated from the actual carrier frequency by a predetermined distance.

* * * * *